United States Patent
Miller et al.

(10) Patent No.: US 6,452,411 B1
(45) Date of Patent: Sep. 17, 2002

(54) EFFICIENT PARALLEL TESTING OF INTEGRATED CIRCUIT DEVICES USING A KNOWN GOOD DEVICE TO GENERATE EXPECTED RESPONSES

(75) Inventors: Charles A. Miller, Fremont; Richard S. Roy, Danville, both of CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/260,460

(22) Filed: Mar. 1, 1999

(51) Int. Cl.[7] .............................................. G01R 31/26
(52) U.S. Cl. ...................................... 324/765; 714/736
(58) Field of Search ................................. 324/754, 765, 324/158.1; 714/736, 735, 737

(56) References Cited

U.S. PATENT DOCUMENTS

| | | | |
|---|---|---|---|
| 3,821,645 A | * 6/1974 | Vinsani ...................... 714/736 |
| 4,370,746 A | 1/1983 | Jones et al. .................... 371/27 |
| 4,455,654 A | 6/1984 | Bhaskar et al. |
| 4,773,028 A | * 9/1988 | Tallman ...................... 714/736 |
| 4,942,576 A | 7/1990 | Busack et al. ................. 371/21 |
| 5,070,297 A | 12/1991 | Kwon et al. ................. 324/158 |
| 5,243,274 A | 9/1993 | Kelsey et al. |
| 5,357,523 A | 10/1994 | Bogholtz, Jr. et al. |
| 5,363,038 A | 11/1994 | Love |
| 5,442,282 A | 8/1995 | Rostoker et al. |
| 5,447,160 A | 9/1995 | Love |
| 5,497,079 A | 3/1996 | Yamada et al. |
| 5,506,499 A | 4/1996 | Puar |
| 5,648,661 A | 7/1997 | Rostoker et al. |
| 5,682,472 A | 10/1997 | Brehm et al. |
| 5,689,515 A | 11/1997 | Panis |
| 5,701,666 A | 12/1997 | DeHaven et al. |
| 5,794,175 A | 8/1998 | Conner |
| 5,839,100 A | 11/1998 | Wegener |
| 5,910,895 A | 6/1999 | Proskauer et al. |
| 5,923,178 A | 7/1999 | Higgins et al. |
| 5,995,424 A | 11/1999 | Lawrence et al. |
| 5,995,915 A | 11/1999 | Reed et al. |
| 6,064,213 A | 5/2000 | Khandros |
| 6,064,948 A | 5/2000 | West et al. |
| 6,246,250 B1 | 6/2001 | Doherty et al. |
| 6,256,760 B1 | 7/2001 | Carron et al. |
| 6,275,962 B1 | 8/2001 | Fuller et al. |

FOREIGN PATENT DOCUMENTS

| | | |
|---|---|---|
| JP | 61-099876 | 5/1986 |
| JP | 6-027195 | 4/1994 |

OTHER PUBLICATIONS

International Search Report PCT/US 00/04864.
IBM Technical Disclosure Bulletin N–UP Test Adapter XP 000627991.
Yuji, Ebihara "Patent Abstracts of Japan", vol. 18, No. 241, p. 1733, May 9, 1994 (Publication No. 06027195, Feb. 4, 1994).

* cited by examiner

Primary Examiner—Michael Sherry
Assistant Examiner—Russell M. Kobert
(74) Attorney, Agent, or Firm—N. Kenneth Burraston; Stuart L. Markadeau (57) ABSTRACT

A system for testing integrated circuit devices is disclosed in which a tester communicates with a known good device through a channel. Tester-DUT interface circuitry is provided for monitoring the channel while the tester is writing data as part of a test sequence to locations in the known good device. In response, the interface circuitry writes the data to corresponding locations in each of a number of devices under test (DUTs). The interface circuitry monitors the channel while the tester is reading from the locations in the known good device (KGD), and in response performs a comparison between DUT data read from the corresponding locations in the DUTs and expected responses obtained form the KGD.

26 Claims, 5 Drawing Sheets

EFFICIENT PARALLEL TESTING OF INTEGRATED CIRCUIT DEVICES USING A KNOWN GOOD DEVICE TO GENERATE EXPECTED RESPONSES

The subject matter in this application is related to material in two other U.S. patent applications of Roy and Miller, entitled DISTRIBUTED INTERFACE FOR PARALLEL TESTING OF MULTIPLE DEVICES USING A SINGLE TESTER CHANNEL, U.S. patent application Ser. No. 09/260,463, and PARALLEL TESTING OF INTEGRATED CIRCUIT DEVICES USING CROSS-DUT AND WITHIN-DUT COMPARISONS, U.S. patent application Ser. No. 09/260,459, filed on the same date as this application and expressly incorporated herein by reference.

BACKGROUND INFORMATION

This invention is related to the testing of integrated circuit devices using a semiconductor tester, and more particularly to testing a number of devices in parallel.

Integrated circuit (IC) devices are an important part of almost every modern electronic or computer system. To reduce the manufacturing cost of such systems, the manufacturer expects each constituent IC device to be virtually free of defects and to perform according to its specifications. Thus, it is not unusual to expect that every IC device is subjected to rigorous testing prior to being shipped to the system manufacturer.

It has been determined, however, that a significant portion of the total cost of producing an IC device can be attributed to its testing. That is because many modern IC devices perform complex functions, have a large number of inputs and outputs, and operate at high speeds. For instance, a 256 Mb memory device may have 16 data lines and 22 address lines. A simplistic approach to test such a device would be to write a known data value to each memory location, read from the location, and then compare the value read to the written value (expected value) to determine any negative results (errors). However, because of the large number of locations, each containing several bits, such a technique of testing each bit and combination of bits at each location is expensive and time consuming. The field of test engineering has developed to create efficient techniques for detecting as many errors as possible while using the least number of test sequences.

Figure 5:
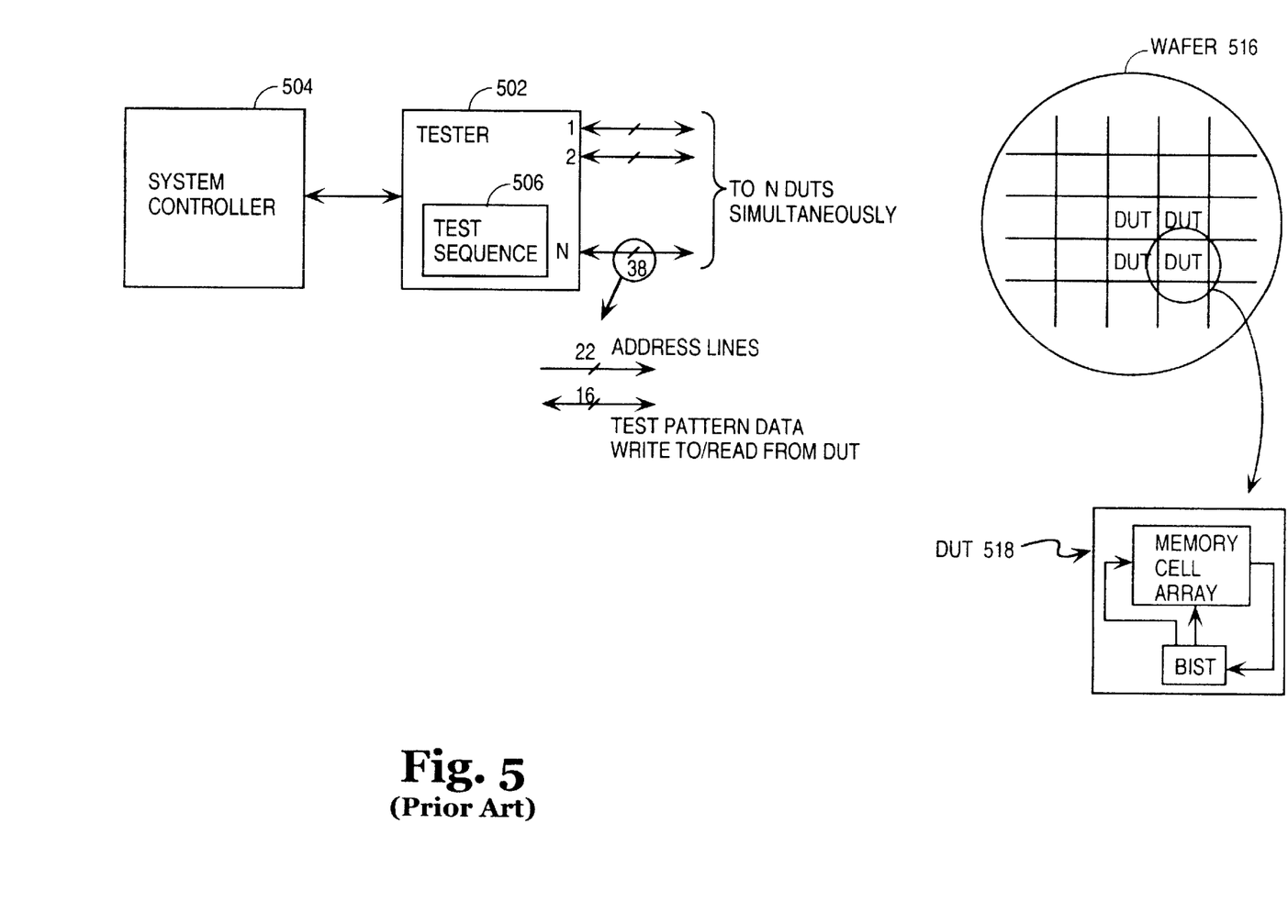
FIG. 5 shows a conventional test system.

A memory device may be tested using an automated semiconductor tester. FIG. 5 shows such a tester 502 having a number (N) of channels for parallel testing of a number of devices under test 518 (DUTs.) The DUT 518 may have a memory cell array and built-in self test (BIST) circuitry. The tester 502 normally executes a test program and in response generates data and addresses which define a test sequence 506 engineered for testing the particular DUTs. The data and addresses on each channel of the tester are fed to a respective DUT, so that a number of DUTs, corresponding to the number of channels, may be tested simultaneously. A probe card (not shown) receiving all N channels delivers address and write data of the test sequence to locations in the N different DUTs simultaneously. The tester 502 can read the data from the locations in the DUTs for comparison with expected data. This may occur while the DUTs are still part of the semiconductor wafer 516 as shown. The results of the comparison help determine whether some portion of the device is functioning improperly, for example whether a particular bit read from a location in the memory device is in error. The tester performs the above read and write cycles many times with the same or different data patterns to verify as many locations of the DUTs as possible given time and budget constraints.

To increase the throughput of the test system in terms of the number of DUTs tested per unit time, a larger tester may be built with more channels. Such a solution, however, could be prohibitively expensive. The tester 502 is a complex and high speed machine, requiring much time and expense to modify or improve. Moreover, a single channel of a modern tester may comprise between 50 to 100 signal wires, such that increasing the number of channels between the tester and the probe card will make it physically impractical to connect all of the signal wires to the probe card. Therefore, a more efficient solution for increasing the throughput of an IC test system is needed.

SUMMARY

According to an embodiment of the invention, a test apparatus is disclosed that contains a trusted location that holds a reference copy of test information, and a test circuit that has an interface to the trusted location. In combination with the test apparatus, a connection may be provided for the test circuit to access a number of DUTs, and to test each DUT based on the reference, copy obtained form the trusted location. The test circuit may snoop a connection between a test host and the trusted location, and can identify commands on the connection and interpret them for local action. For instance, the test apparatus may include intermediate test circuitry positioned between a semiconductor tester and the DUTs. The intermediate circuitry obtains valid data from the trusted location, e.g., in a known good device, and compares the valid data with data read from the DUTs to determine the error status of the DUTs. The results of the test may then be communicated to the test host.

The test host may itself issue commands to the test circuit to configure the local action. The test circuit includes logic means for detecting these commands, and for managing local test functions. The latter may include propagating writes to one or more connected DUTs in parallel, in response to having snooped writes to the trusted location. When the DUTs have memory circuitry to be tested, the test circuit may also manage the memory circuitry as needed by, for instance, applying refresh cycles.

A particular embodiment is a system having a tester, a known good device, a channel coupled between the tester and the known good device for data communication between the known good device and the tester, and interface circuitry for monitoring the channel. The tester writes data as part of a test sequence to locations in the known good device and subsequently reads data from corresponding locations in each of a number of devices under test (DUTs). The interface circuitry monitors the channel while the tester is writing and reading to and from the locations in the known good device and in response performs a write or read from corresponding locations in the DUTs. The interface circuitry may also make comparisons between data from the known good device and data from the DUTs.

DETAILED DESCRIPTION

As briefly summarized above, an embodiment of the invention provides for more efficient testing of a number of similar, and preferably identical, IC devices in parallel without altering the test program or the conventional tester. From the point of view of the tester, each channel is still testing a single device, in this case the known good device (KGD), according to the conventional test sequence. The tester-DUT interface circuitry monitors the channel while the tester is writing data as part of a test pattern to locations in the known good device. The interface circuitry then writes the data to corresponding locations into 1 to M DUTS. When to the tester is reading from the locations in the known good device, the interface circuitry detects such a read and itself reads DUT data from corresponding locations in the DUTs. Hence, the tester does not have to explicitly produce expected data for the read comparison, which contributes to overall faster testing. A comparison is then made by the interface circuitry using the DUT data read from the DUTs to generate error information. The tester or system controller may then read the error information provided by the interface circuitry, according to a manufacturing fabrication flow process.

Figure 1:
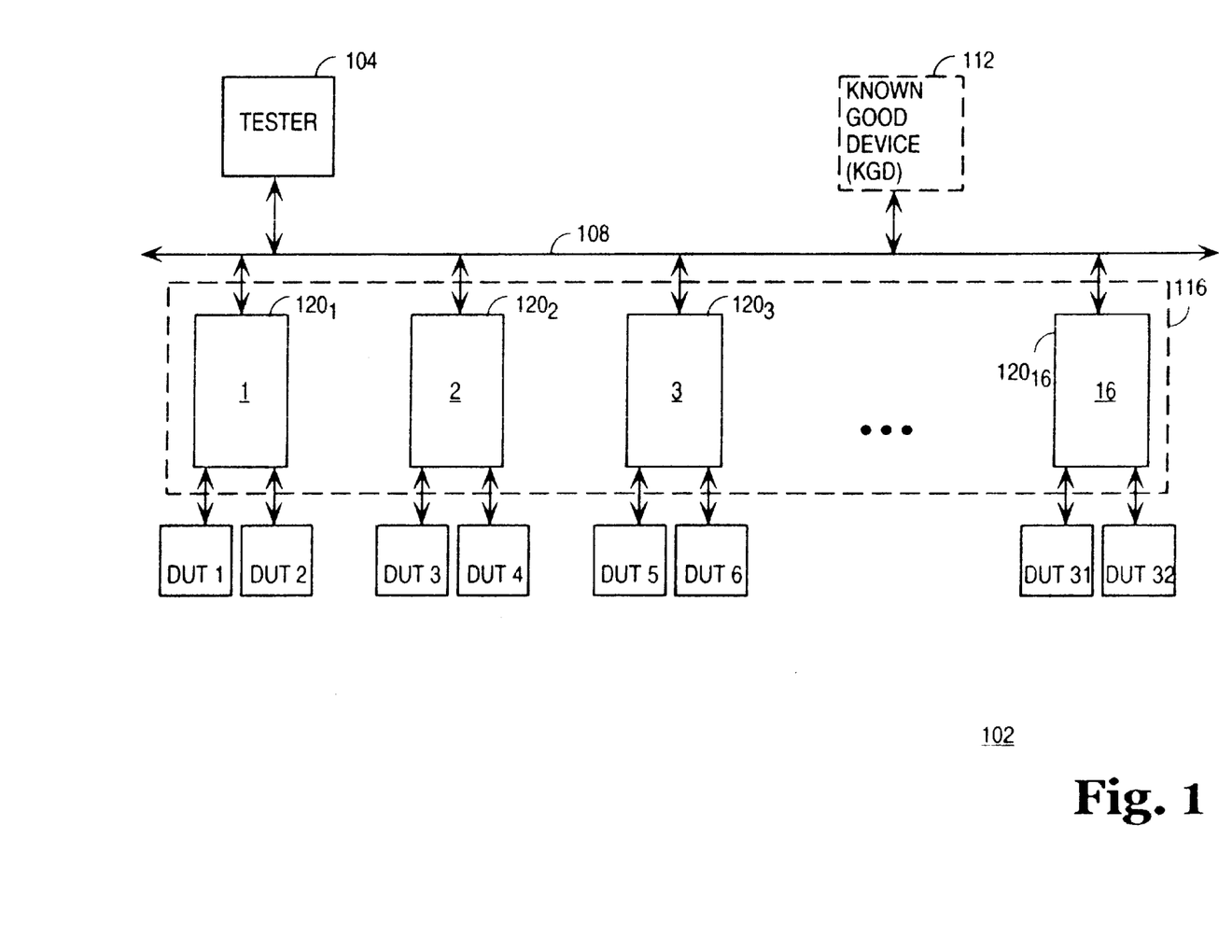
FIG. 1 illustrates a block diagram of a test system according to an embodiment of the invention.

FIG. 1 illustrates a block diagram of a test system 102 according to an embodiment of the invention. In a particular embodiment, the tester may be the HP83000 model by Hewlett Packard, Inc., a tester which complies with the popular Direct Rambus Dynamic Random Access Memory (DRDRAM) memory device specification. Alternatively, other types of testers and channels suitable for automated testing of IC devices, and in particular memory devices, may be used, including, for example, a high speed serial bus. A DUT may itself be a memory chip, or it may be an arbitrary semiconductor device including a memory portion thereof. A known good device (KGD) 112 is communicatively coupled to the tester 104 via the channel 108. The KGD may be an actual specimen of a DUT which has undergone a sufficient amount of testing to ensure it is a good device with no errors. Alternatively, the KGD may be hardware that simulates the behavior of an actual DUT under error free conditions.

Coupling the DUTs to the channel is the interface circuitry 116. In the particular embodiment shown in FIG. 1, the interface circuitry 116 comprises a number of substantially identical tester-DUT interface blocks $120_1$, $120_2$ ... ($120_i$). One or more of these may be implemented as a separate application specific integrated circuit (ASIC) chip. Alternatively, the functionality described below for each block $120_i$ may be separated among several chips. Although sixteen blocks are shown in FIG. 1, in general a fewer or greater number M may be used, considering the number of DUTs to test and the load capabilities of the channel 108. Yet other circuit configurations for interfacing the DUTs to the channel 108 may be developed by one of ordinary skill in the art in view of the functionality described in this disclosure. In addition to the functions of monitoring the channel and reading and writing from the DUTs, the interface circuitry 116 may also be configured to compare KGD data and timing with DUT data and timing read by the interface. The KGD data and timing may be obtained by the interface circuitry 116 snooping the channel 108 while the tester is reading from and writing to the KGD.

Figure 2:
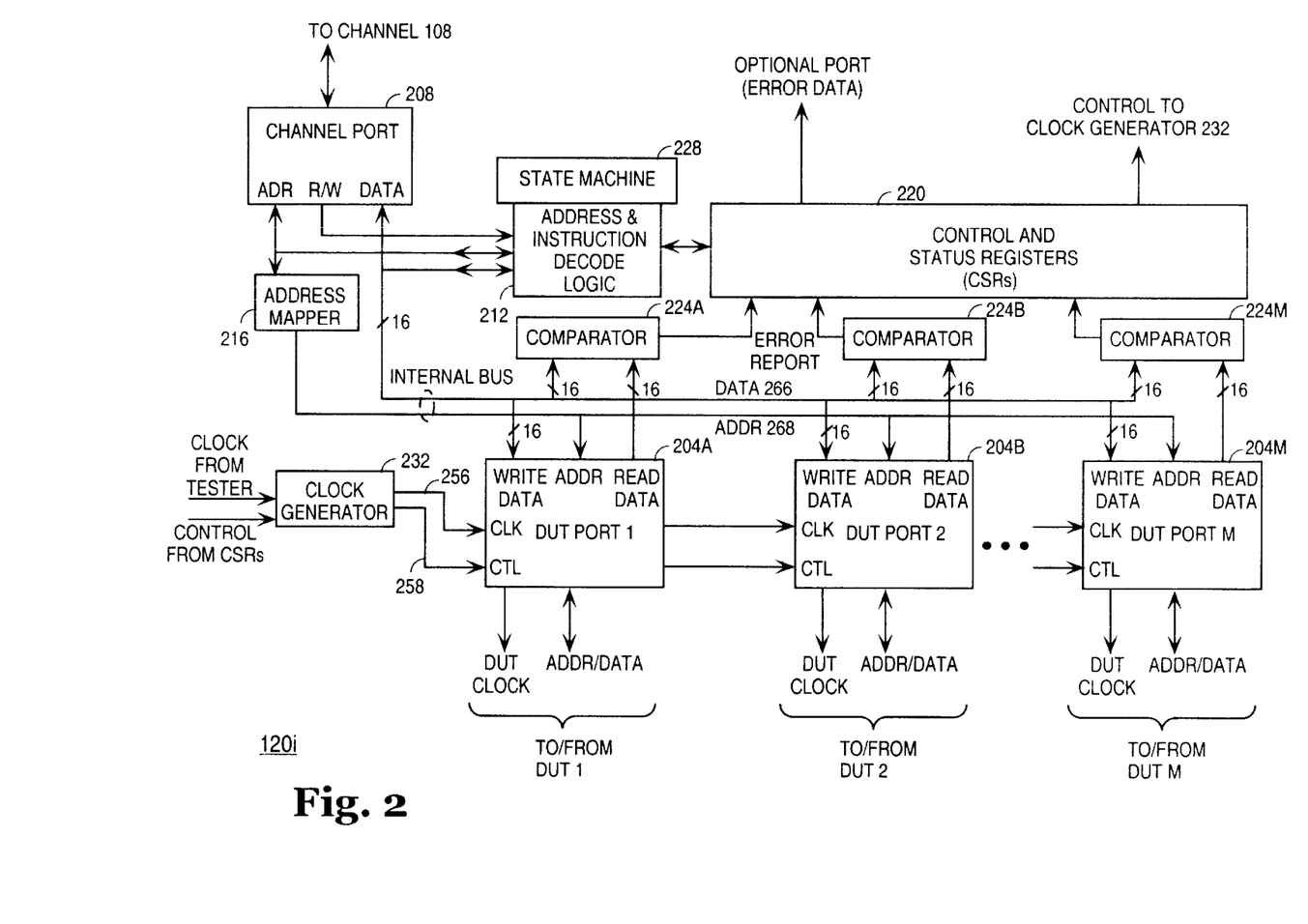
FIG. 2 shows a block diagram of a portion of a tester-DUT interface block according to an embodiment of the invention.

FIG. 2 shows a block diagram of a portion of the tester-DUT interface block $120_i$ that constitutes the interface circuitry 116 according to an embodiment of the invention. For the particular version in FIG. 2, up to M DUT ports may be provided, each for interfacing a single DUT. The DUT ports 204a and 204b write to and read from their respective DUTs in response to address and data received from a channel port 208 and in response to other control indications from address and instruction decode logic 212. After the address, data, and control (e.g., Read/Write) information are captured from the channel 108 by the channel port 208, they are fed to the address and instruction decode logic 212. The logic 212 monitors read and write transaction in the channel 108 by decoding the address, data, R/W signal, and control information received from the channel port 208 to determine the next operation of the logic 212 (read to or write from the DUTs). Each block $120_i$, and more particularly the address and decode logic 212, has knowledge of the address range of the known good device 112 (see FIG. 1), so that when the tester 104 is writing to or reading from the known good device 112, the block $120_i$ can invoke the same read and write transactions with its respective DUTs. Additionally, the decode logic 212 is aware of the address range of a number of control and status registers (CSRs) and of the DUT ports. This enables the tester to access each of the DUT ports separately over the same channel 108, but at different times. The address range may include control information used to set appropriate bits in the CSRs 220 to initialize Hi the block $120_i$ and to place the block $120_i$ in different modes of operation. Each individual block $120_i$, and hence the entire interface circuitry 116, may be placed into different modes of operation by writing to and reading from the CSRs 220.

To allow the tester 104 full access to each separate DUT, each of the DUT ports should be assigned a different address range. An address mapper 216 is provided to map the address of a location in the KGD to corresponding locations in the DUTs. For instance, if the address range of the KGD is 0–64M, the address range for DUT port 1 could be 64–128M, the address range for DUT port 2 could be 128M–196M, and so on. This also allows the DUT ports to share the same address lines in the block $120_i$, yielding a more efficient circuit configuration for each block.

A comparator circuit 224 is provided for performing a comparison using DUT data which has been read from its respective DUT. In the particular embodiment of FIG. 2, each of the comparators receive two sixteen bit values, one being read data from a respective DUT and the other being read data from the KGD received from the channel port 208. Clock resynchronization and pipeline registers may be used to align data at each comparator 224. Although the internal data bus 266 is 16 bits wide in this example, a wide range of alternative widths for the data bus 266 and address bus 268 may be used. Each comparator 224 generates raw error data being the result of bit-wise XOR operations performed upon a DUT data value and a KGD data value. This raw error data may be stored either in the CSRs 220, or in a memory (not shown) separate from each block $120_i$. The tester 104 may then access this memory at a later time, through the channel 108 or through an alternative path, to read the raw error data.

As an alternative or in addition to providing raw error data, a compression scheme may be implemented where, for instance, a single error bit is generated for each respective comparison. This gives an indication that an error has occurred in a given group of bits of a given DUT, without specifying which bit among the many in that group is actually in error. This allows, for instance, a channel 108 having a data bus being 16 bits wide to deliver error information back to the tester for up to 16 DUTs simultaneously. Other schemes for compressing the result of the comparison may be implemented if desired, such as those described in related patent applications of Roy and Miller filed on the same date as this application and entitled Distributed Interface for Parallel Testing of Multiple Devices Using A Single Tester Channel U.S. patent application Ser. No. 09/260,463, and "Parallel Testing of Integrated Circuit Devices Using Cross-DUT and Within-DUT Comparisons" U.S. patent application Ser. No. 09/260,459, now pending both of which are incorporated herein by reference. Normally, any error data together with the address of the location exhibiting the error and the particular DUT involved are stored in the CSRs 220 until accessed by the tester 104. Flags may be set in the CSRs 220 in response to receiving such error information from the comparators 224. These flags may indicate errors in a particular DUT or in a particular range of addresses. They may be read by the tester 104 following completion of the test sequence to quickly determine if any errors were encountered. The tester 104 can then optionally test the address range or DUT that is in error in a more detailed manner to determine which specific bit(s) are in error.

Referring to FIG. 2, a DUT clocking signal 256 is used by the DUT ports to synchronize the writing to and reading from the respective DUTs, and to resynchronize the data from the channel port 208 to a DUT port. The signal 256 may be provided by a clock generator 232 comprising either a phase-locked or delay-locked loop. The clock generator 232 runs based on a clock signal received from the tester 104. The clock generator 232 also provides a clock control signal 258 for varying the phase of the clock fed to each DUT with respect to the clock signal received from the tester 104. This may be used for clock margin testing of each DUT. The DUT clocking signal 256 and control signal 258 may be varied by programming the CSRs 220.

Figure 3:
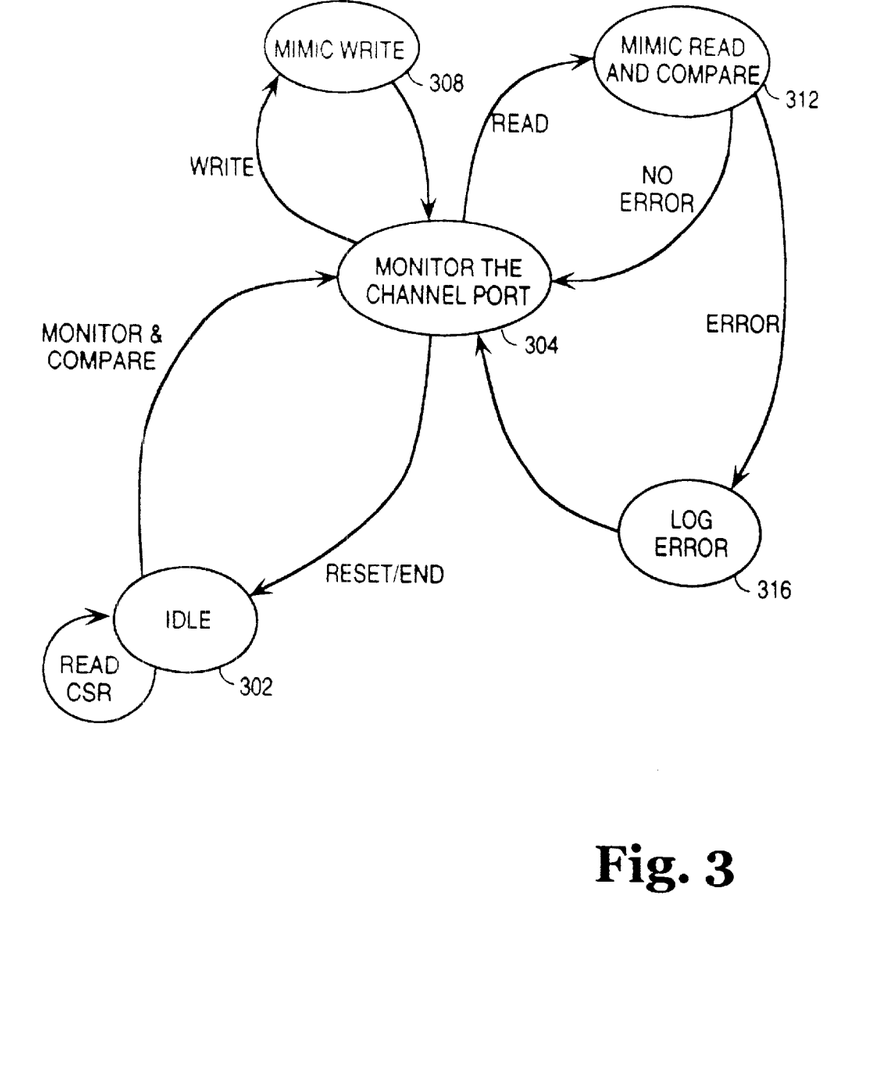
FIG. 3 shows a state diagram of a state machine used in the tester-DUT interface block.

The decode logic 212 in response to detecting a read or write to a particular address range signals a state machine 228 to transition into the appropriate state as shown in the bubble diagram of FIG. 3. Operation of each block $120_i$ as well as the overall test system 102 may be explained in conjunction with this state diagram. Operation normally begins with the tester 104 initializing the interface circuitry 116, e.g., by initializing each interface block $120_i$, by sending a write transaction over the channel 108 directed at the address range of the CSRs 220. Alternatively, a machine other than the tester 104 can perform the initialization of the CSRs 220 and of each block $120_i$ through an auxiliary port (not shown) that may be coupled to the CSRs 220. After the block $120_i$ has been initialized or reset, it is in the Idle state 302 as indicated in FIG. 3. While Idle, however, the block $120_i$ will normally be reading its CSRs 220 regularly. Before the tester 104 starts to execute its test sequence and write to the known good device 112, the tester 104 writes to the CSRs 220 requesting a change in the mode of operation to the Monitor state 304. The state machine 228 responds by entering the Monitor state 304. In that state, the block $120_i$ monitors the channel 108 while the tester 104 is writing data to the KGD 112. In response to a write transaction detected by the decode logic 212, the block $120_i$ enters the Mimic Write state 308 in which the KGD bound data is captured from the channel 108 and is written to corresponding locations in each DUT. Write transactions continue to be mimicked in this way until the tester 104 enters a read cycle.

During the read cycle, the tester 104 will normally read from locations in the KGD 112 to which data has been previously written. The decode logic 212 detects such read transactions and signals the state machine 228 to enter the Mimic Read state 312. In this state, the block $120_i$ mimics the tester's read transaction on all of the DUTs and performs comparisons to determine errors in the DUTs. When mimicking a tester read transaction, a KGD data value (expected value) available on the channel 108 will be latched by each comparator 224. The decode logic 212 initiates a read from corresponding locations in the DUTs which brings DUT data values into each comparator 224, one from each DUT. A comparison may then be made between the read data value from the KGD and the read data value from a corresponding DUT. Since the KGD data value was provided by a "good" device, the KGD data value is the expected response and may properly be used to determine errors, if any, in a corresponding DUT data value.

If the comparison result is favorable, i.e., no error, the state machine 228 reverts back to the Monitor state 304. On the other hand, if the comparison yields a negative result, i.e., a difference between the DUT data and the corresponding KGD data, then the Log Error state 316 is entered wherein the error data are logged. The state machine 228 then returns to the Monitor state 304. The logging of errors may involve storing the raw error data in the CSRs 220, or in a separate memory as mentioned earlier. Once the tester 104 has completed its test sequence, it may write to the CSRs 220 to reset or end the monitoring, thus returning the state machine 228 to the Idle state 302.

Additional states (not shown) may be provided which configure the block 120i to deliver the raw error data or compressed error data to the tester 104 or to another machine. Thus, in addition to the ability to simultaneously test a number of DUTs in parallel as described above, the interface circuitry 116, and in particular each block $120_i$, may be further configured to have a bypass mode. In this mode, being programmable through the CSRs 220, all channel transactions monitored by the decode logic 212 will be mimicked on a selected one of the DUT ports. In this mode, only one DUT at a time can be accessed over a single channel of the tester 104. The bypass mode can be utilized for locating errors in specific bits at a given address of a particular DUT, after having read compressed error data from the CSRs 220. Alternatively or in addition, the bypass mode can be utilized as a debug tool for debugging the test program.

Figure 4:
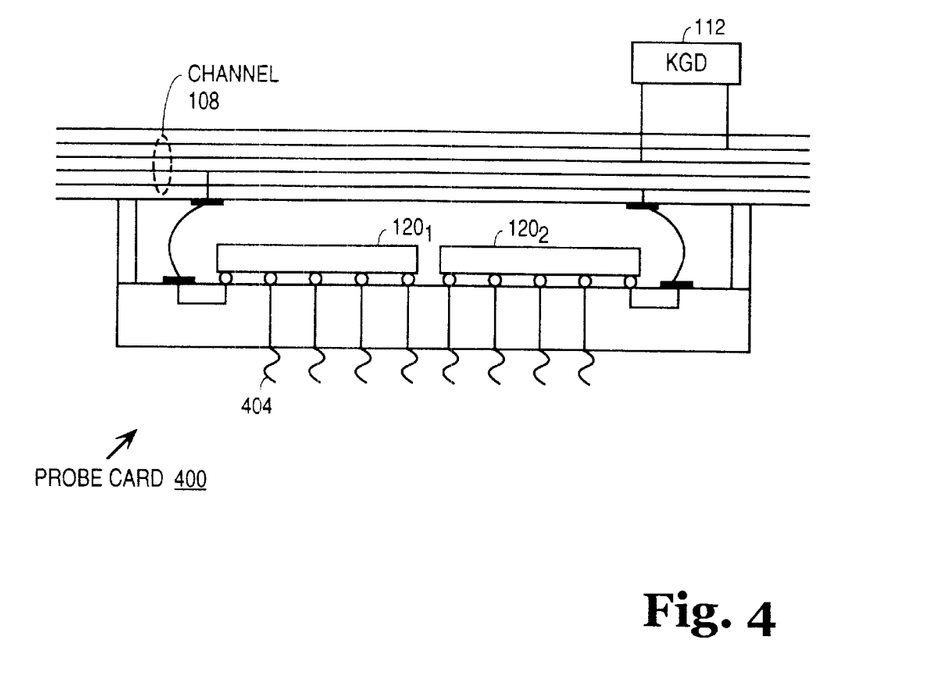
FIG. 4 illustrates a probe card carrying a known good device and two tester-DUT interface blocks according to another embodiment of the invention.

FIG. 4 illustrates a wafer probe card 400 comprising blocks $120_1$ and $120_2$ of the interface circuitry 116, according to another embodiment of the invention. The probe card 400 features a number of probes 404 for electrically connecting signal points of a DUT to its respective DUT port in the block $120_i$, to allow access to such DUT. In operation, the probe card 400 is lowered on to the surface of a wafer to contact the signal points of the DUTs that form the wafer. Further details concerning this embodiment may be found in the patent application of Roy and Miller entitled Distributed Interface for Parallel Testing Mutiple Devices Using A Single Tester Channel U.S. patent application Ser. No. 09/260,463, now pending.

To summarize, various embodiments of the invention have been described for efficient parallel testing of integrated circuit devices using a known good device to generate an expected response. For instance, by letting the tester 104 operate a KGD 112 on each channel according to a conventional test program and test sequence, the costs associated with modifying the test program to verify a number of DUTs on each channel are minimized. The use of the interface circuitry 116 between the DUTs and a single channel of the tester 104 permits such parallel testing of multiple DUTs per channel. When the interface circuitry 116 is located on the wafer probe card 400, there is no need to substantially increase the number of wires between the tester 104 and the probe card 400 for testing multiple DUTs per channel, thus further promoting a high throughput yet economically efficient test system. As can be appreciated from the above, certain embodiments of the invention provide the advantage that the tester, its test program and core test sequences, including margins and vectors, are not substantially affected by the invention. The test program is modified only slightly, such as by the addition of a short routine that reads the error information generated by the interface circuitry.

One of ordinary skill in the art will recognize that the invention is capable of use in various other combinations and environments and is capable of changes and modifications within the scope of the inventive concept expressed here. For instance, although the embodiments of the invention described above are particularly useful for testing memory die as part of a wafer using a wafer probe card, the concept of parallel testing of DUTs may also be carried out at the package level where the DUTs are part of packaged IC dies. Also, the error information provided by the interface circuitry may be used during a final test of packaged die to simply pass or fail an entire package rather than specify errors in exact bit locations. Accordingly, it is intended that all such modifications and/or changes be within the scope of the claims.

What is claimed is:

1. A test system comprising:
   a tester;
   a reference device;
   a communication channel communicatively interconnecting said tester and said reference device;
   interface circuitry communicatively coupled to said channel and a plurality of semiconductor devices;
   a state machine communicatively coupled to said interface circuitry, said state machine comprising:
      a monitor state in which said interface circuitry monitors said communication channel,
      a write state, said state machine entering said write state upon detecting a write operation by said tester of test data to said reference device on said communication channel, said interface circuitry writing said test data detected on said communication channel to each of said semiconductor devices while said state machine is in said write state, and
      a read state, said state machine entering said read state upon detecting a read operation by said tester of response data from said reference device, said interface circuitry reading said response data detected on said communication channel and reading corresponding response data from each of said plurality of semiconductor devices while said state machine is in said read state; and
   a comparator configured to compare said response data read from said reference device with said response data read from each of said semiconductor devices.

2. The system of claim 1, wherein results of said comparison by said comparator are communicated to said tester over said communication channel.

3. The system of claim 1 further comprising a second communication channel, wherein results of said comparison by said comparator are communicated to said tester over said second channel.

4. The system of claim 1 further comprising a memory for storing results of said comparison by said comparator.

5. The system of claim 1 further comprising means for comparing semiconductor device timing with reference device timing, said reference device timing being obtained by monitoring said channel while said tester is writing to and reading from said reference device.

6. The system of claim 1 further comprising a probe card, said probe card comprising a plurality of probes for contacting signal points on said semiconductor devices, each said probe communicatively coupled to said interface circuitry.

7. The system of claim 6, wherein said interface circuitry is disposed on said probe card.

8. The system of claim 6, wherein said reference device is disposed on said probe card.

9. The system of claim 6, wherein said state machine is disposed on said probe card.

10. The system of claim 6, wherein said comparator is disposed on said probe card.

11. The system of claim 6, wherein at least two of said interface circuitry, said reference device, said state machine, and said comparator are disposed on said probe card.

12. The system of claim 6, wherein at least three of said interface circuitry, said reference device, said state machine, and said comparator are disposed on said probe card.

13. The system of claim 6, wherein said interface circuitry, said reference device, said state machine, and said comparator are disposed on said probe card.

14. A test system comprising:
   a reference device;
   test means for writing test data to said reference device and reading response data from said reference device;
   interface means for communicating with a plurality of semiconductor devices;
   channel means for providing at least one communication channel, said tester means, said reference device, and said interface means being communicatively interconnected to said channel means; and
   state machine means for controlling said interface means, said state machine means comprising a monitor state, a write state, and a read state, wherein
   while in said monitor state, said state machine means causes said interface means to monitor said channel means,
      said state machine means enters said write state upon detecting a write operation by said test means of test data to said reference device on said channel means, and while in said write state, said state machine means causes said interface means to write said test data detected on said channel means to said semiconductor device, and
      said state machine means enters said read state upon detecting a read operation by said tester of response data from said reference device, and while in said read state, said state machine causes said interface means to read said response data detected on said channel means and to read corresponding response data from said semiconductor device.

15. The system of claim 14 further comprising comparator means for comparing said response data read from said reference device with said response data read from each of said semiconductor devices.

16. The system of claim 15 further comprising means for communicating a result of said comparison by said comparison means to said test means.

17. The system of claim 16 further comprising memory means for storing a result of said comparison by said comparison means.

18. The system of claim 16 further comprising means for comparing timing associated with said semiconductor devices with timing associated with said reference device, said timing associated with said reference device being obtained by monitoring said channel means while said test means is writing to and reading from said reference device.

19. The system of claim 14 further comprising probing means for contacting signal points on said semiconductor devices.

20. The system of claim 19, wherein said interface means is disposed on said probing means.

21. The system of claim 19, wherein said reference device is disposed on said probing means.

22. The system of claim 19, wherein said state machine means is disposed on said probing means.

23. The system of claim 19, wherein said comparator means is disposed on said probing means.

24. The system of claim 19, wherein at least two of said interface means, said reference device, said state machine, and said comparator means are disposed on said probing means.

25. The system of claim 19, wherein at least three of said interface means, said reference device, said state machine, and said comparator means are disposed on said probing means.

26. The system of claim 19, wherein said interface means, said reference device, said state machine, and said comparator means are disposed on said probing means.

* * * * *